United States Patent
Moore et al.

(10) Patent No.: US 9,611,451 B2
(45) Date of Patent: Apr. 4, 2017

(54) METAL-SAFE SOLID FORM AQUEOUS-BASED COMPOSITIONS AND METHODS TO REMOVE POLYMERIC MATERIALS IN ELECTRONICS MANUFACTURING

(71) Applicant: John Moore, Camarillo, CA (US)

(72) Inventors: John Cleaon Moore, Camirillo, CA (US); Richard Tsai, New Taipei (TW); Frank Chiu, Hsinchu (TW)

( * ) Notice: Subject to any disclaimer, the term of this patent is extended or adjusted under 35 U.S.C. 154(b) by 14 days.

(21) Appl. No.: 14/425,750

(22) PCT Filed: Sep. 2, 2013

(86) PCT No.: PCT/US2013/057760
§ 371 (c)(1),
(2) Date: Mar. 4, 2015

(87) PCT Pub. No.: WO2014/039409
PCT Pub. Date: Mar. 13, 2014

(65) Prior Publication Data
US 2015/0232792 A1    Aug. 20, 2015

Related U.S. Application Data

(60) Provisional application No. 61/697,441, filed on Sep. 6, 2012.

(51) Int. Cl.
| | | |
|---|---|---|
| C11D 3/08 | (2006.01) |
| C11D 3/10 | (2006.01) |
| C11D 3/26 | (2006.01) |
| C11D 11/00 | (2006.01) |
| G03F 7/42 | (2006.01) |
| C11D 3/30 | (2006.01) |
| C11D 3/04 | (2006.01) |
| C11D 3/33 | (2006.01) |
| C11D 3/00 | (2006.01) |
| C11D 3/12 | (2006.01) |
| C11D 3/28 | (2006.01) |
| C11D 1/00 | (2006.01) |

(52) U.S. Cl.
CPC ............ *C11D 11/0047* (2013.01); *C11D 1/00* (2013.01); *C11D 3/0073* (2013.01); *C11D 3/044* (2013.01); *C11D 3/08* (2013.01); *C11D 3/1213* (2013.01); *C11D 3/1233* (2013.01); *C11D 3/28* (2013.01); *C11D 3/30* (2013.01); *C11D 3/33* (2013.01); *G03F 7/42* (2013.01)

(58) Field of Classification Search
CPC .. C11D 1/00; C11D 3/044; C11D 3/08; C11D 3/1213; C11D 3/1233; C11D 3/0073; C11D 3/28; C11D 3/30; C11D 3/33
USPC ....... 510/175, 176, 225, 229, 232, 233, 445, 510/446, 447, 499, 500, 477, 488, 511; 134/1.2, 1.3
See application file for complete search history.

(56) References Cited

U.S. PATENT DOCUMENTS

| | | | | |
|---|---|---|---|---|
| 5,654,421 A | * | 8/1997 | Taylor ................. | C07D 223/10 510/220 |
| 6,686,328 B1 | * | 2/2004 | Binder ................. | C11D 3/3707 510/224 |
| 6,770,616 B1 | * | 8/2004 | McGowan ........... | C11D 3/2075 510/224 |
| 6,974,789 B1 | * | 12/2005 | Whitaker .............. | C11D 3/046 510/294 |
| 2003/0100464 A1 | * | 5/2003 | Kott ......................... | C11D 1/37 510/357 |
| 2007/0244025 A1 | * | 10/2007 | Timmann ........... | C11D 17/0078 510/445 |
| 2008/0004202 A1 | * | 1/2008 | Wolfgang .......... | C11D 17/0078 510/439 |
| 2009/0137449 A1 | * | 5/2009 | Holderbaum ............ | C11D 1/72 510/446 |
| 2013/0284210 A1 | * | 10/2013 | Hueffer ................ | C11D 7/3245 134/25.2 |

* cited by examiner

*Primary Examiner* — Gregory R Delcotto

(57) ABSTRACT

Compositions and methods useful for the removal of organic substances from substrates, for example, electronic device substrates, are provided. A method is presented which uses a minimum amount of solid form concentrate that is diluted into water, introduced into a manufacturing tool and heated, applied to said substrate for a sufficient time to allow penetration and removal of an organic substance, and immediately rinsed with water to achieve complete removal. These compositions and methods are particularly suitable for removing and completely dissolving photoresists of the positive variety most commonly used in the manufacture of a flat panel display (FPD) and other electronic substrates.

10 Claims, No Drawings

US 9,611,451 B2

METAL-SAFE SOLID FORM AQUEOUS-BASED COMPOSITIONS AND METHODS TO REMOVE POLYMERIC MATERIALS IN ELECTRONICS MANUFACTURING

CROSS-REFERENCE TO RELATED APPLICATION

This application claims the benefit of U.S. Provisional Application No. 61/697,441, filed Sep. 6, 2012.

FIELD OF THE INVENTION

The present invention relates generally to the removal of polymeric materials from a substrate. In particular, the present invention relates to solid form physical state aqueous-based compositions and the manner they remove amorphous and thermoset polymers from electronic devices during their manufacture.

BACKGROUND OF THE INVENTION

The manufacture of microelectronic devices requires various polymers to be used as a temporary photoresist ("resist") mask during a photolithography process. These polymers may comprise a range of chemistries to include novolac, polyhydroxystyrene, acrylic, silicone, epoxy, and mixtures thereof, but most commonly the novolac resin that is common to the support of positive acting lithographic systems. After establishing the resist mask, further processing is carried out on an inorganic substrate (e.g. glass, silicon, silicon dioxide, aluminum, copper) as in the case of a thin film transistor (TFT), liquid crystal display (LCD), or the substrate may exist as a thin organic film (e.g. polyimide, polyester) as in the case of manufacturing organic light emitting diode (OLED) devices, collectively and for purposes of this invention, these units are referred to as flat panel displays (FPD). The same or similar practices occur in the manufacture of semiconductor and microelectromechanical (MEMS) devices. Upon completion, the resist mask must be stripped (removed) without effect to the adjacent metals, dielectric, or underlying substrate. It is a desire to provide compositions that comprise metal-safe and solids-borne materials and the associated methods that are proven effective to remove a resist mask and its residue from substrates during electronics manufacturing.

Typical lithographic processes use resist that is exposed to actinic radiation through a photomask, and following its development, rinsing, and drying, the positive or negative acting tone of this resist will produce a corresponding pattern. This pattern provides the design for specific inorganic and organic matter to be etched away (removed) from or deposited (added) onto the substrate. After the process is complete, the resist pattern must be removed, leaving behind the specific pattern design that is spread across the substrate in a layer-like manner. This layering effect is repeated multiple times, comprising different designs and materials, until the final layered device is complete. Of specific importance to this process is the efficient and reliable removal of photoresist and other polymers following each layering practice during electronics manufacturing.

Positive photoresists are commonly composed of novolac or polyhydroxystyrene (Phost) resins and represent the largest volume portion of photoresists produced globally. Applications in microelectronic manufacturing include substrate etching and electrodeposition. These processes commonly require exposing the substrate surface to acidic mineral acids (e.g. sulfuric, hydrochloric, phosphoric, and hydrofluoric) and mixtures of these acids with oxidants (e.g. peroxide, nitric). To achieve the necessary chemical resistance, the photoresist must be baked at elevated temperatures to condense its polymeric framework and oxidize the top skin of its coating, and produce a resistant framework to acidic chemistries in electroplating processes and oxidizing chemistries used in etching. Once this wet-etch or deposition process is complete, the highly baked photoresist must be effectively removed such that no residue remains to allow subsequent processes to proceed without special treatments. It is a desire in electronics manufacturing to effectively remove high-baked photoresist following wet chemical processing without additional special steps.

Positive-tone resists are also used as imaging masks in processes which use plasma-based etching (e.g. dry etching). Lithography practices to produce the resist mask are conducted similarly as is done for wet-etch processing, however, the substrate is present in a reduced vacuum plasma chamber. In this chamber, the substrate lies in a polarized charged radio-frequency condition as established by the chamber operation, whereby upon introduction of gaseous species, the gases become ionized and are attracted to the charged condition of the substrate. The electronics substrate, albeit inorganic, organic, etc., may have metallic layers pre-deposited upon its surface and over that is present the resist mask pattern. Within the vacuum chamber and using specific control of the gaseous mixture (e.g. boron trifluoride, oxygen, argon, etc.), ionized species are formed and bear down onto the substrate to react and produce gaseous by-products (e.g. silicon-fluoride, etc.) that are pulled away by the low vacuum conditions of the tool and captured in a cold trap. During the etching, plasma exposure to the resist mask can exceed 150 degrees C. The plasma impact onto the resist generates a cloud of carbon containing compounds, which redeposit along with other by-products of substrate attack. This redeposit occurs within the active zone of the etching to produce a resistant layer of material along the dimensional wall or along-side the point of contact to the substrate, producing a penetrating geometry via or trench with the redeposit along its wall (side-wall polymer).

The presence of this side-wall polymer is common for all plasma etch processes. This residue is chemically composed of by-products of the plasma, substrate, and organic constituents of resist, for example, silicon, oxygen, carbon, gallium, arsenic, boron, phosphate, titanium, tantalum, tungsten, copper, nickel, aluminum, chromium, fluorine, chlorine, and others. Etch residue can be referred to as an organometallic mixture comprising inorganic species that are bound by carbon-containing material. As described earlier, removal of the resist mask and its residue is required for successful microelectronic manufacturing. Resist mask and residue removal must effectively remove such material following plasma processing.

Successful chemistries for removing side-wall polymer and other resist etch residue must directly interact with the inorganic ions by leaching, suspending, and complexing while the binding effects of the organic material is removed. These cleaners are commonly composed of organic solvents, amines, water, reducing agents, chelating agents, corrosion inhibitors, and surfactants. U.S. Pat. No. 5,496,491 (1995), Ward et al., and U.S. Pat. No. 5,911,835, Lee et al., presents stripping compositions that comprise polar solvents, amines, and inhibitors, as well as hydroxylamine and ethylenediamine tetraacetic acid (EDTA) performing upon micron sized aluminum topographies resulting from plasma processing of microelectronic devices. The reducing agent, hydroxylamine, has been cited extensively in the literature offering selective resist and residue stripping while protection of underlying metal features. Regardless of the choice in the chemistries cited by these inventions and others, the common manufacturing practice involves the management and delivery of large volumes of organic solvent used as the stripper. Aqueous-based compositions of matter which remove resist masking and residue are attractive to the fab. It is beneficial to conduct microelectronic manufacturing in a manner that discourages the use of organic solvents, minimizes safety risk to workers, reduces costly permitting and tool design, and minimizes impact to the environment from wastes.

While it is critical to exhibit good performance in resist stripping within a rapid time frame, it should be understood that these chemistries must be compatible with the design and practice in the tool, as well as the materials of construction. In a common cleaning tool that is designed for resist stripping on large FPD substrates, the parts travel on a conveyor from one chamber to another, from resist stripping, to DI water rinsing, and completing the process with a drying step. During the course of stripping in an FPD processing tool, there normally exists at least two (2) product tanks, and customarily three (3) tanks, that are separate and distinct and arranged in-line with the flow direction of the parts. Substrates entering the tool will be first "washed" by the chemistry in the first tank. The chemistry is sprayed onto the substrate surface, and upon reacting with the resist by swelling, lifting-off, and dissolution from the substrate, it is collected and returned to the tank where it is mixed with existing bulk chemistry, heated and filtered to remove any suspended and undissolved materials, and cycled back to the spray chamber where the process is repeated, whereby this practice proceeds in a continuous manner. To this end, if a company is to consider a new cleaning chemistry, it is always the desire to not change their tooling for reasons of process control, cost, and most important, engineering investment. Should benefits exist which suggest a new chemistry, it is preferred to use the same tool and simply tune the process to meet the performance requirements. It is therefore preferred to conduct new candidate chemistries which remove resist and residue by processing within the same existing tool used at the customer site.

Consistent with the need of the FPD tool that contains confined chambers that support a continuous process, the desired compositions of matter shall be of the low-foaming variety and exhibit a high bath life. The characteristic of foam generation is common for many industrial-grade detergents, for example, in car washes and pavement steam washers, where the presence of foam is preferred as a visual indicator for the presence of soap with a subsequent knee-jerk requirement for rinsing. However, foam is not acceptable for precision parts cleaning, and in some cases will produce a disaster condition. The phenomena of foam is described as the agglomeration of millions of air bubbles which act as a barrier to chemical interaction with the soil and impede its removal. As foam is generated with spray agitation and the moving parts of the tool, it migrates beyond the chamber to other areas outside the tool, and in worse case conditions will spread to the production area (fab) and collect in pools where it produces an unsafe condition for workers, contamination source, and a medium for electrical shock with low-lying high voltage wiring from adjacent equipment. When this occurs, the cleaning tool must be shut down and serviced. With this in mind, formulations must maintain low surface tension for good wetting yet minimize foam, a challenge for a chemist as the occurrence of foam is promoted by driving down surface tension. Whenever operating a chemistry in the fab, it is always an objective to minimize foam production to a level deemed acceptable for use in the tool.

Selectivity in any resist removal process cannot be over emphasized. Namely, as more aggressive chemistries are formulated to achieve a desired performance, this practice must be met without damage to sensitive metals and the underlying substrate. This is especially challenging for resist removal as the reactive agent of choice are alkaline. When using aggressive alkalis, for example alkali hydroxides, they cannot be used without the aid of inhibitors. When these materials are used alone, they raise the pH of the system, cause galvanic corrosion to adjacent metals, while destroying the substrate. Of particular concern in electronics manufacturing is the use of aluminum or alloys thereof. In fact, the aluminum metal that is present in such microelectronic configurations may survive the resist and residue removal step but begin to corrode during rinsing. This is explained by the momentary mixing between the resist stripper and DI water such that the stripper chemistry is diluted until all that remains on the substrate surface is DI water. Depending upon the tool configuration, spray performance, and the absence of any pooling, eddy currents or other irregularities, the complete rinsing may take only seconds. As with most manufacturing processes, irregularities become the norm which may stretch the completion of rinsing and subsequently expose the substrate to diluted stripper chemistry, whereby the pH remains high while a corrosion inhibitor may be diluted to non-reactive state. In this situation, galvanic corrosion of a microscopic region of ultra-sensitive aluminum or its alloy will occur swiftly and present itself during inspection by a scanning electron microscope (SEM) image as a range of conditions from the most serious as the absence of the feature due to it being completely etched (removed) to an intact feature that is stained (blackened). Some companies have attempted to avoid this rinse phenomena by the addition of an interim rinse with isopropanol (IPA), however, this practice is both expensive and a flammability hazard. There is a need, accordingly, for improved stripping compositions which will remove the processed resist in a rapid manner during rinsing with DI water, and preventing the corroding, gouging, dissolving, dulling, or otherwise marring of the microelectronic features.

Many choices exist for aluminum inhibitors, for example, catechol is added to resist stripper chemistries as disclosed in U.S. Pat. Nos. 5,482,566, 5,279,771, 5,381,807, 5,334,332, 5,709,756, 5,707,947, and 5,419,779 and in WO 9800244. However, catechol exhibits certain health and safety compliance issues, and more specifically, catechol is cited as a suspected carcinogen. Several initiatives are active in the electronics industry to discourage the use of hazardous materials and any items that produce unwanted measurable or perceived health risk. The toxicity of catechol, substituted catechol, and pyrogallols, all exhibit a regulated toxicity level that is deemed unacceptable for electronic manufacturing. A key desire is to provide compositions of matter that are safe and exhibit low risk to workers in an electronic manufacturing fab.

It is further well known that silicates offer good protection to aluminum and its alloys in alkaline conditions. This is a common practice in the industrial detergent industry, however, these products typically contain alkaline earth metals such as sodium and potassium, both of which are known contaminant ions for microelectronics. The industry has published guidelines for defining the purity of raw materials in terms of the presence or absence of alkali elements. Non-alkali element silicates (e.g. alkyl silicates) are used in resist strippers as disclosed in JP 1120552 and U.S. Pat. No. 4,628,023, however, these materials exhibit limited solubility. In fact, all silicates have a critical dependence upon solubility, as exemplified in sol-gel technology whereby gels and pourable solutions may be produced from silicates, simply through pH control and the ratio of a semi-aqueous mixture. Given this background, silicates become a good choice for an inhibitor, however, premature deposition and residue must be prevented. It is a further desire to provide compositions of matter that are infinitely soluble in DI water and will not produce a condition of redeposit or residue while being used in electronics manufacturing.

Additionally and most important, there is continued loading of the stripper chemistry with the organic substance, causing a reduction in bath life and if not given proper attention, will reach a condition whereby the activity of the chemistry is exceeded, performance is not achieved within the defined process time and an observation of residue occurs on the surface of the substrate. Bath life may be defined in a number of ways, however, most common to fabs is the number of parts cleaned per unit volume of chemistry for a specific process condition. While cleanliness of the parts is observed as complete dissolution and removal of polymer within the time governed by the process condition, this practice of dissolution can be explained by fundamental laws in chemistry and physics whereby molecular mobility leading to dissolution is directly influenced by temperature and agitation. Higher temperature and agitation leads to higher molecular mobility, minimizing aggregates and precipitates forming, achieving a greater amount of polymer dissolving, and ultimately an increase in bath life. To increase bath life, it may seem a simple act to increase temperature and agitation, however, it becomes impractical due to limitations in operating the tool (e.g. frequency of parts movement, etc.) and the chemistry which most fabs use industrial policy limit of 10 degrees C. above the flashpoint (FP) of the liquid (SEMI S3-91, *Safety Guidelines for Heated Chemical Baths*). Most important, the risk of damage should be discouraged by the increased frequency of parts movement and corrosion associated with operating at higher temperature. It is further a desire to provide compositions of matter and methods to achieve increased bath life in electronics manufacturing.

Due to the reduced cost structures available, the manufacture of virtually any electronic device is most competitive when it is conducted in Asia. It is understood that the easiest way to reduce manufacturing costs are by increasing the bath life of the cleaning chemistry. Increasing bath life reduces the time intervals to switch-out used with new chemistries, the need for solution heating, and other maintenance practices. Using compositions of matter of a concentrated state, and more specifically, the compositions of matter existing in a concentrated solid state, bath life is increased by replenishing the active agent as it is consumed. In the case of adding solid form active compositions of matter, a relatively small amount of concentrate is added, little or no adjustment is required to the volume, and the process temperature is constant. In the case of a FPD manufacturing line, typical replenishment occurs only for tank #1 (i.e. the "dirty tank"), while the follow-on tank #2 and tank #3 (e.g. for 3 tanks) remain in their existing condition as a level of process assurance. With the simple attention being given only to tank #1, a bath life increase for the entire process is observed to be up to three (3) times that of a normal organic solvent system. It should be noted here that organic solvent systems do not inherently have solid-form concentrated species available to conduct replenishment practices to realize a significant increase in bath life. For maximum flexibility in electronics manufacturing, it is a desire to provide solid-form compositions of matter and methods to increase bath life by simple replenishment directed to the tank chemistry.

As alluded earlier in this invention description, FPD manufacturing requires large volumes of organic solvent chemistry to remove resist and residue from the substrate surface. At the time of this writing, estimates for organic solvent usage for this application are measured in units of metric tons, exceeding several hundred thousand metric tons per year. It is further estimated that 70-80% of this amount is recycled with the remainder becoming a hazardous waste that must be incinerated or buried. The use of organic solvents requires material storage at the fab and a shipping system that cycle the waste off-site to a recycler and return it to the point of use, every step requiring inspection and analysis. Alternatively, this invention as present in a solid-form concentrate may be stored onsite at the fab location, yet is expected to occupy a fraction of storage space due to expected mix practices in DI water to vary between 2-5%. Most importantly, the invention's waste may be treated onsite at the fab location using pH neutralization and filtration technology similar to that practiced for resist developer. In fact, the invention waste may be co-mingled (mixed) with the developer waste. To this end, no storage, shipment, recycling, testing, etc., is required for the invention waste management. Solid born materials are desirable to minimize storage space and waste management practices as compared to conventional activities associated with organic solvents.

Taking these challenges together, there is a pressing need to provide a consistent and universal process, which uses compositions of matter that vary depending upon the performance needs of the unique polymer or residue to be removed, which provides high performance, high throughput, a green process, all at a reduced cost of ownership. Now, therefore, these needs must be met by a material that achieves high performance character within a rapid time frame and operates within a conveyorized spray tool designed for processing large substrates that are typical of the variety found in manufacturing FPDs. The invention outlined in this document provides aqueous-based and solids born compositions that meet the desires stated here as well as discourages the use of organic solvents and is a green product. The invention is a drop-in replacement for organic solvents and meets foam controls and metal safety for the manufacturing of FPDs. Because of the solid form nature of the product, it is simple diluted with DI water and replenishes the bath to provide an increase in useful life of the chemistry to a level whereby the raw-material cost of organic solvents becomes a significant cost. These and other benefits provided by this invention and the variations which may be practiced by those in the art, all provide novelty and improvement in the removal of resist and their residues. Such inventions are considered to be valuable for the processing of FPDs.

SUMMARY OF THE INVENTION

In accordance with this invention, a chemical composition and the manner that it is used is provided to strip processed photoresist from an inorganic substrate in a rapid manner while protecting metal safety to aluminum and aluminum alloys. It is an object of this invention chemistry to be aqueous dissolving and made up of ingredients which by themselves or as a completed mixture exhibit the form of flakes, granules, powder, prills, paste, or collectively a "solid form".

It is another object of this invention to provide a metal-safe chemistry, whereby after it is dissolved into DI water, it removes resist mask and residues resulting from the processing of electronics and allows the work to be conducted in the same tool as that designed for organic solvents. In other words, this invention is considered as a direct or drop-in replacement for organic solvents with no new tool or special equipment required and the associated rinsing and drying steps are considered the same.

It is another object of this invention to provide a fundamental change in composition of matter that is based upon aqueous chemistries. These materials are in contrast with organic solvents by providing safe materials for workers, lower cost and complexity for permitting, improved compatibility with tools (i.e. no explosion-proof devices), and reduction in waste generation.

It is a further object of the invention to provide a simple and lower cost means for shipping, storage, on-site preparation, and replenishment. Since DI water is provided at all manufacturing locations, it is of interest for practicality and flexibility to provide the active agent in the most concentrated solid form. When providing replenishment, the invention is proven to increase the working life of the product by a factor of three times that of organic solvents.

These objects, and other objects which will become apparent from the description which follows, are achieved by the multi-functional composition of the invention which comprise a mixture of:
(a) an inhibitor defined as a protecting agent to include chelating, complexing, or reducing agents of the known varieties, including benzylic hydroxides such as catechol, triazoles as benzotriazole and tolytriazole, imidazoles, borates, phosphates, alkyl or elemental silicates, sulfur containing products as thiourea and other thio functional grouped species, ethylenediaminetetraacetic acid, diethylenetriaminepentaacetic acid, nitrilotriacetic acid, and 2,4-pentanedione, reducing sugars, hydroquinones, glyoxal, salicylaldehyde, fatty acids such as citric and ascorbic acid, hydroxylamines, rosin acids, acrylic acids, or vanillin; and,
(b) an alkali which exhibits an aqueous base dissociation constant of $\geq 1 \times 10^{-3}$ ($pK_b \leq 3$) comprising preferably of the form MO, MOH, M(OH)$_2$, M$_y$CO$_3$, M$_y$(PO4)$_z$, MOC(CH$_3$)$_3$, and MO, where M may exist as Na, K, Li, Cs, Rb, Ca, Mg, Sr, Ba; y is equal to 1, 2, or 3 and z is equal to 1 or 2 or (R)$_4$NOH where R$_4$ may exist as (CH$_3$)$_4$, (CH$_2$CH$_3$)$_4$, (CH$_2$CH$_2$CH$_3$)$_4$, or (C$_6$H$_6$) (CH$_3$)$_3$; and,
(c) one or more additives consisting of surfactants representing one or a mixture of the known varieties, including fluorinated systems, nonionic nonyl-phenols and nonyl-ethoxylates with a HLB (hydrophilic/lipophilic balance) ranging from 7-15, anionic forms that include alkyl-sulfonates, phosphate esters, succinates, and of specific interest in surfactant chemistry are the long-chain systems comprising nonionic and cationic forms offering hydrophobic surface activity; polymers offering anti-deposit or dispersing activity which exhibit high water solubility and are selected from one or more groups consisting of alcohol ethoxylates, bisphenol ethoxylates and propoxylates, alkylbenzene salts, cellulose acetate phthalate, cellulosic derivatives of alkoxyethyl and hydroxypropyl, copolymers of ethylene and propylene oxide, dendritic polyesters, ethoxylated amines, ethoxylated alcohol salts, ethylene acrylic acid, hydroxy-methacrylates, phosphate esters, polyethylene glycols, polyethylene imine, polyethylene oxides, polyvinyl alcohol, polyvinyl pyrollidinone, starch, styrene maleic anhydride, sulfonated acrylics, sulfonated polystyrenes, sulfopolyester of the linear or branched formula, and rosin acids;

wherein the major component is ingredient (a), and this amount is expressed as a relative ratio to the amount of (b) as (a):(b), whereby the numerical ratio of the weight percent of each component expressed as (a)/(b) varies from 1 to 10 and the combined weight percent (wt %) of amounts of (a)+(b) varies from 10 to 99% of the entire invention mixture with the remainder as component (c), and sum total of the composition (collectively (a)+(b)+(c)) is observed to be of a solid physical form and free from extraneously added water (i.e. anhydrous).

The invention contemplates the provision of stripping (removing) photoresist and residual polymeric organic substances (i.e. post-etch residue) from inorganic substrates, comprising contacting the polymeric organic substance with the stripping composition of this invention for a period of time sufficient to remove said polymeric substances. This invention conducts this provision within the processing parameters of a conventional tool used to strip and clean substrates in a manner suitable for the manufacture of electronics substrates with consideration given to continuous material cycling to achieve the definition of high bath life.

The terms "stripping" and "removing" are used interchangeably throughout this specification. Likewise, the terms "stripper" and "remover" are used interchangeably. The indefinite articles "a" and "an" are intended to include both the singular and the plural. All ranges are inclusive and combinable in any order except where it is clear that such numerical ranges are constrained to add up to 100%. The term "wt %" means weight percent based on the total weight of the stripping composition, unless otherwise indicated.

While the present invention provides stripping compositions and a method which can effectively remove polymeric organic substances from a substrate, they are particularly adapted for removing photoresists that include positive-tone of both novolac (i.e. cresol formaldehyde) and polyhydroxy styrene (PHost). These organic substances are employed in the fabrication of substrates, for example, the substrates necessary to support electronic devices, which may include various layers and structures such as metal, semiconductor, and the associated organic materials. Typical substrate materials include, for example, glass and ceramic, quartz, and thin organic materials as polyimide, polyester, and others deemed successful for the manufacture of electronics.

DETAILED DESCRIPTION OF THE INVENTION

The present invention provides a metal-safe aqueous stripping composition, which exists in a physical solid form prior to dilution and preparation, and methods of use to quickly and effectively remove polymeric organic substances from inorganic substrates such as those used to manufacture electronics. The stripping composition comprises a blend of chemistries to include an inhibitor or mixture thereof defined as a protecting agent, an alkaline agent that exhibits an aqueous base dissociation constant of $\geq 1 \times 10^{-3}$ ($pK_b \leq 3$), and one or more additives consisting of surfactants and water soluble polymers, which effectively removes photoresist mask and its residue while achieving innumerable benefits in the fabrication of microcircuits.

The invention is an aqueous-based system designed to remove resists and residue that is in profound contrast to the current use of organic solvents for the same purpose. Organic solvent stripping of resists and residue, albeit a standard practice in the industry, is the very condition of this invention's baseline comparison, whereby numerous benefits to lower cost and improve safety help to define its novelty and unique practice. The benefits of this invention exceed the obvious benefits of low-cost when considering only the raw materials. For example, a typical end-use concentration mixture of the invention is between 2-5% (wt %) of the collective solid-form mixture added to DI water. In other words, 95-98% DI water combines with the invention's final mixture at the point of use. All microelectronic fabrication facilities have direct access to DI water measured in mass quantities every day during the manufacturing of their product. Because of its ubiquitous nature and availability, DI water is often considered to be an insignificant cost to the facility as compared with the use of organic solvents. For these reasons and others, the use of DI water to clean parts is an accepted practice and viewed as safe and low cost for both the workers and the final product.

Alternatively, the use of organic solvents requires a raw material not directly available to the fabrication facility, most commonly this is a blend of materials, and is provided by external suppliers. Depending upon the organic mixture, the components may trigger certain hazardous criteria as toxicity and flammability, requiring their permitting for use in the facility at a given risk to workers and operating cost within the tool. For example, it is known that certain businesses that manufacture FPDs use large quantities as measured in metric tons of n,n-dimethylacetamide (DMAC, CAS #127-19-5), however, the product is considered a developmental toxin by the USEPA issue in May of 2010 of the safe drinking water standard (1986, *Proposition* 65). Although DMAC may be an excellent solvent for polymeric substances, its use in large volumes within enclosed fabrication facilities presents a health and safety risk to workers. Further, the solvent must be also reviewed and tested for its compatibility in the moving parts of the tool and filtration system. Upon completing a risk review for health and safety and tool compatibility, the organic solvent is permitted and approved for use. The solvent system must be purchased, inspected, shipped, stored, used, inspected repeatedly at numerous times during its use, and ultimately collected as a waste material, stored again into separate containers, and shipped off-site for recycle to be considered later for re-introduction into the process.

When the use of the invention is compared with organic solvents, and it is known that ≥95% of DI water is mixed with the invention to prepare a metal-safe resist and residue stripper, the contrast becomes a comparison between DI water and organic solvents. Because DI water is readily available at the fabrication facility, there are significant benefits in reducing the cost of raw materials, storage space, health and safety risk, and waste generation. Promoting the use of DI water over organic solvents is also preferred for substrate and tool compatibility. As the manufacture of FPDs consider flexible thin organic substrates, compatibility is generally improved with chemistries based upon DI water as compared to organic solvents. Further, the periodic addition of concentrated chemistries to DI water for cleaning will allow the working life of the system to be increased far greater than is possible with organic solvents which are unable to incur the same adjustment practice. It is the objective of this invention, it's novelty, and unique design, to promote aqueous chemistries as solid-form concentrates while being used in DI water dilution that provides maximum flexibility to the manufacturing facility.

Upon application of the invention in the end-use form of the aqueous alkaline mixture to contact the resist polymeric framework, the polymer breaks down, allowing the disintegrated residue to be rinsed away with water. The removal rates will, of course, vary depending upon the thickness of the resist coating and the condition to which the coating was exposed during the process. Heating assists in facilitating the removal and dissolution of resist and residue.

As is the case with many manufacturers of FPDs and other electronics, the resist choice is positive-tone, typically a novolac variety. Without wishing to be bound by any particular theory, it is believed that the alkali component of the invention penetrates the void space of the resist polymer and dissolves non-crosslinked novolac. These cresol and cresol-formaldehyde based resins (e.g. novolac) exhibit at least one free alcohol (e.g. OH) functional group and are readily soluble in alkaline systems. In fact, this represents a fundamental formulation design for development of the positive-tone resist, whereby its solubility is governed by the unexposed form of the photoinitiator, diazonapthaquinone (DNQ). In the unexposed condition, DNQ is hydrophobic and renders the resist resin insoluble based upon its dispersion throughout the matrix. However, once exposed, the DNQ molecule changes to a ketene, which in the presence of moisture, converts to a carboxylic acid. Therefore, resist removal occurs rapidly based upon the existing resin aqueous alkali solubility and the effects of dispersed DNQ acidity to accelerate its breakdown. Throughout the surface of a FPD, resist removal may occur at slightly different rates based upon the chemistry to penetrate into the top skin of the resist, diffusion into the underlying resin, and release of underlying pieces to the bulk stripper followed by exposure of the underlying material.

The resist dissolution process described here is typically conducted in a tool where the chemistry is heated and sprayed onto the surface, a physical process that is considered to be aggressive. To afford protection for transition metals such as copper and aluminum, a suitable inhibitor or protecting agent is chosen that comprises a silicate, combined with a triazole, a citrate, and possibly a film forming agent such as polyvinylpyrrolidone. Silicates most commercially available include sodium, potassium, and lithium based, however, the sodium versions are discouraged for electronics applications due to their propinquity to penetrate the substrate and cause electromigration issues. The preferred inhibitor ingredients include a silicate of the trade name identity, KASOLV 16 (PQ Corporation), which may be used singularly or be mixed with one or more of the following: a conventional triazole as BTA (benzyltriazole), TTA (tolytriazole), MBTA (mercaptobenzyltriazole), citrates may be included as tribasic potassium citrate ($C_6H_5K_3O_7$), a rosin acid of the trade name identity, JON-CRYL 682 (BASF Corporation), and a film-former as PVP K-series (International Specialty Products, ISP), where K varies from 15-120 (MW 6,000-3 m). The inhibitor package may exist as combinations thereof, incorporated into the stripper composition.

The alkali agent of the invention is desired to be highly dissociative in water to achieve maximum strength when diluted in DI water, preferred to exhibit a dissociation constant of $\geq 1\times 10^{-3}$ ($pK_b \leq 3$), and most preferred $\geq 1\times 10^{-2}$ ($pK_b \leq 2$). The alkali agent may exist singularly or in a mixture which comprises the molecular form, excluding water of hydration within the complex: $M_nO$ (oxide), MOH (hydroxide), $M_yCO_3$ (carbonate), $M_y(PO_4)_z$ (phosphate), $MOC(CH_3)_3$ (butyrate or butoxide), where M may exist as Na, K, Li, Cs, Rb, Ca, Mg, Sr, Ba and n may be 1, 2, or 3 and m may be 1 or 2 and the alkali agent may also exist as RNOH where R may be $(CH_3)_4$, $(CH_2CH_3)_4$, $(CH_2CH_2CH_3)_4$, or $(C_6H_6)(CH_3)_3$, the preferred alkali is KOH or LiOH and the most preferred is a combination of KOH and LiOH.

The total amount of inhibitor (identified as (a)) in the invention is present at a level relative to the amount of alkali agent (identified as (b)), the weight percent (wt %) ratio of inhibitor relative to alkali ((a)/(b)) varies from an equal amount ((a)/(b)=1) to a level that is greater than the alkali level by a factor of 10 ((a)/(b)=10), and the sum total weight percent (wt %) of alkali and inhibitor present in the inhibitor varies from 10 wt % to about 99.9 wt %, and preferable of the order of about 50 to about 85 wt % is sufficient.

To effect small geometry penetration and prevention of redeposit or scale formation from premature drying of the stripper prior to rinsing, the stripping compositions also comprise surfactants, water soluble polymers and other additives. These items ensure the stripper functions properly while resist is loaded into the chemistry to discourage residue formation with more solids dispersed into solution. The additives may be derived from, but not limited to, surfactants such as nonionic alcohol ethoxylates nonylphenols and nonyl-ethoxylates with a HLB (hydrophilic/lipophilic balance) ranging from 7-15, anionic forms that include alkyl-sulfonates, phosphate esters, and succinates, and fluorinated systems, bisphenol ethoxylates and propoxylates, alkylbenzene salts, cellulose acetate phthalate, cellulosic derivatives of alkoxyethyl and hydroxypropyl, copolymers of ethylene and propylene oxide, dendritic polyesters, ethoxylated amines, ethoxylated alcohol salts, ethylene acrylic acid, hydroxy-methacrylates, phosphate esters, polyethylene glycols, polyethylene imine, polyethylene oxides, polyvinyl alcohol, polyvinyl pyrollidinone, starch, styrene maleic anhydride, sulfonated acrylics, sulfonated polystyrenes, sulfopolyester of the linear or branched formula, or rosin acids. These additives may be used singularly or in combinations thereof with the inhibitor protectant and alkali agent at weight percent levels varying from 0.1 wt % to about 90 wt %, and preferable of the order of about 15 wt % to about 50 wt % is sufficient.

The temperature employed for suitable performance is dependent upon the resist processing conditions. In most cases, the temperature in the range from about 20° C. (room temperature) to about 80° C. is effective for proper operation of the aqueous stripping compositions of the present invention. Processing conditions may require using a temperature in excess of about 40° C., especially where the removal of more than one substance is desired such as the simultaneous stripping of a resist mask and sidewall polymer. When operated under the conditions stated within the customer's tool, the stripping composition quickly and effectively removes organic polymers from metallized and metallic surfaces.

The disclosed invention differs from conventional organic solvent stripping processes in that it is an aqueous soluble system that is either comprising solid-form ingredients or collectively the final composition is of a physical solid form. It is therefore this solid-form aqueous resist stripper described here which provides the key novelty behind this invention and delivers several benefits in the manufacture of electronics. Such benefits begin with the extreme concentrated nature of the invention to minimize shipping costs, reduce storage space, improve worker safety, and eliminate wastes. The invention provides a broad improvement to performance and responsible care in the industry. To this end, the novelty and unique nature of this invention is considered a significant milestone in the elimination of organic solvents.

In employing the stripping solutions of this invention, the electronics substrate covered with the baked resist and residue is brought into contact with the stripping solution usually within a conveyor operated tool moving from one chamber to another where a spray apparatus exists to deliver the invention stripper that has been prepared by dilution into DI water and heated to a temperature of between 40-90° C., preferably 60-70° C. Times required for stripping the resist vary to quite an extent depending on the resist type, thickness, and exposure condition, but for common positive-tone systems of <2 microns (um) and baking of ~100° C., the times range from 15-60 seconds per stripping chamber for a triple chamber (3 chamber) tool. Generally, the time involved will be less than 1 minute during optimized performance conditions, while some resist, may require longer times where lower processing temperatures of the invention stripper are employed on highly polymerized and metallized surfaces. It will be appreciated that while many resists are completely dissolved from the substrate, others may be loosened, floated off, and subsequently dissolved in the bulk stripping composition.

In the cases outlined here and without wishing to be bound by any particular theory, it is believed that the metal safe composition performs by the alkali component penetrating the void space of the resist organic layer and reacting with the underlying material to effect dissolution. In the case of cresol and cresol-formaldehyde based resins (e.g. novolac) the alcohol functional groups (e.g. OH) are readily able to react with the alkali to become soluble in the aqueous matrix and be emulsified, where it is then maintained in suspension by the water soluble polymer.

Once the unbound resins of the resist begin to leach out, additional aqueous alkali agent diffuses into these areas and continues the same cycle. This process rapidly proceeds, typically on the order of seconds, and results in the resist pattern exhibiting a loss of adhesion to the substrate. The residual underlying organic substance migrates to the bulk stripper media where additional surface area is exposed and the solvation process described herein continues in an accelerated manner. By this time, the resist mask and residue has been in direct contact with the stripper composition and is lifted from the substrate and surrounded by other active alkali agent to effect further emulsifying and diffusing practice to occur until a completely dissolved state is achieved. Rinsing with DI water will immediately follow.

EXAMPLES

The compositions of the invention and the method of making of the examples are described. It is understood, however, that the invention is not meant to be limited to the details described therein. In the examples, the percentages provided are percent (%) by weight unless otherwise stated.

The invention is further illustrated, without limitation, by the following examples. The measurement of performance and selectivity of the invention is conducted using practices readily accepted by the industry. In such cases, measurement is made by optical microscope, etch rate determinations by high sensitivity gravimetric tests on metallic substrates, and where necessary, more detailed studies by using scanning electron microscopy (SEM).

In the following examples, silicon wafers are used as the inorganic substrate upon which the organic substance is applied and cured. This material forms the basis for the survey, which the invention is demonstrated.

Where applicable, the organic substance is applied in the manner of a coating utilizing a Brewer Science, Inc. CB-100 coater and following standard protocol for applying the liquid form of the polymer material (organic substance) to the said inorganic substrate. Once the material is coated, it is sent to a soft bake step on a hot plate at a defined temperature and time period. The positive photoresist used for demonstration is of the variety AZ-4620 (novolak based), manufactured by AZ Electronic Materials (AZEM), located in Branchburg N.J. (USA, www.azem.com). Where applicable, the material is exposed to ultraviolet light (UV) of a broad-band type emitting at 365 nm and of a high exposure dose of 0.12 W/cm2-sec, for a period up to 30 min.

Example #1

The following example demonstrates the dependence of the resist removal performance on the $pK_b$.value of the active agent prepared to a given concentration in water. Further, this example presents the difficulty in removing resists which have been subsequently baked to higher temperatures.

Coated silicon wafers with AZ-4620 PR are prepared (6" Si), coat 1000 rpm 60 sec 6-8 ml, soft bake cure at 90-100 C, 5 min, reserve for post-bake as described: wafers #1-3, no post bake, wafers #4-6, post bake 130-140 C, 15 min, wafers #7-10, post bake 160-180 C, 15 min. Expose to the following solutions at three (3) different temperatures (room temperature—20 C, 50 C, and 90 C). The active agent solutions are described as follows: tetramethylammonium hydroxide (TMAH, CAS #75-59-2, available from Sigma Aldrich) 0.26N, 95 g of 25% TMAH solution, dilute to 1 L with H2O; potassium hydroxide (KOH, CAS #1310-58-3, available from Sigma Aldrich) 0.26N, 14.6 g of 45% KOH solution, dilute to 1 L with H2O; sodium hydroxide (NaOH, CAS #1310-73-2, available from Sigma Aldrich) 0.26N, 23.1 g NaOH pellets, dilute to 1 L with H2O; diisopropylamine (DIPA, CAS #108-18-9, available from DOW Chemical) 0.26N, 34.1 g DIPA solid, dilute to 1 L with H2O; triisopropanolamine (TIPA, CAS #122-20-3, available from DOW Chemical) 0.26N, 49.7 g TIPA solid, dilute to 1 L with H2O.

The $pK_b$ values of the active agents are found by using the equation $pK_a+pK_b=14$. The values of $pK_a$ are found in the literature and converted to $pK_b$. The resist removal time of each chemistry segregated according to the resist hard bake condition (i.e. no hard bake, 130-140 C (135 C) 15 min, and 160-180 C (170 C) 15 min is given in Tables 1-3, where each table represents the removal condition temperature.

TABLE 1

Resist (PR) removal time (cleaning) in varying chemistries with stated $pK_b$ value based on the equation $pK_a + pK_b = 14$, operated at room temperature (20 C.) of resist exposed to specific hard bake (HB) conditions.

| Active Agent | $pK_a$ | $pK_b$ | Removal (min) No Hard Bake | Removal (min) HB 135 C. 15 min | Removal (min) HB 170 C. 15 min |
|---|---|---|---|---|---|
| TMAH | >13 | <1 | No clean | No clean | No clean |
| KOH | >13 | <1 | No clean | No clean | No clean |
| NaOH | >13 | <1 | 1 min | 1 min | 1 min |

TABLE 1-continued

Resist (PR) removal time (cleaning) in varying chemistries with stated $pK_b$ value based on the equation $pK_a + pK_b = 14$, operated at room temperature (20 C.) of resist exposed to specific hard bake (HB) conditions.

| Active Agent | $pK_a$ | $pK_b$ | Removal (min) No Hard Bake | Removal (min) HB 135 C. 15 min | Removal (min) HB 170 C. 15 min |
|---|---|---|---|---|---|
| DIPA | 8 | 6 | No clean | No clean | No clean |
| TIPA | 9 | 5 | No clean | No clean | No clean |

TABLE 2

Resist (PR) removal time (cleaning) in varying chemistries with stated $pK_b$ value, operated at 50 C. of resist exposed to specific hard bake (HB) conditions.

| Active Agent | $pK_b$ | 50 C. PR removal (min) No Hard Bake | 50 C. PR Removal (min) HB 135 C. 15 min | 50 C. Removal (min) HB 170 C. 15 min |
|---|---|---|---|---|
| TMAH | <1 | No clean | No clean | No clean |
| KOH | <1 | 5 min | No clean | No clean |
| NaOH | <1 | <1 min | <1 min | <1 min |
| DIPA | 6 | No clean | No clean | No clean |
| TIPA | 5 | No clean | No clean | No clean |

TABLE 3

Resist (PR) removal time (cleaning) in varying chemistries with stated $pK_b$ value, operated at 90 C. of resist exposed to specific hard bake (HB) conditions.

| Active Agent | $pK_b$ | 90 C. PR removal (min) No Hard Bake | 90 C. PR Removal (min) HB 135 C. 15 min | 90 C. Removal (min) HB 170 C. 15 min |
|---|---|---|---|---|
| TMAH | <1 | 1 min | 3 min | No clean |
| KOH | <1 | <1 min | 1 min | 1 min |
| NaOH | <1 | <1 min | <1 min | <1 min |
| DIPA | 6 | 3 min | No clean | No clean |
| TIPA | 5 | No clean | No clean | No clean |

Example #2

The following example demonstrates the dependence of metal safety as moles of inhibitor ($M_i$), moles of active agent ($M_a$), expressed as the ratio ($M_i/M_a$) and represented numerically prepared as 5% (wt %) in water. In this case, the chosen inhibitor is an alkali silicate of the form potassium silicate (KASOLV® 16, a powder with ~53% $SiO_2$ (wt %), PQ Corporation). The respective silicate is a solid form material with protective quality dependent upon the silicon dioxide content (wt % $SiO_2$). Aluminum is tested for metal safety by immersion methods at temperatures of approximately 90 degrees centigrade. Aluminum metal is used as foil (aluminum foil, Reynolds Heavy-Duty, domestically available). Metal safety is measured using the observation of bubbles during immersion, the condition of the foil following exposure, and using a measured difference in the gravimetric weight of the specimens before and after their exposure. Gravimetric test results convert mass change into etch rate as angstroms/min. The following equation is used for this conversion: $R=[W \times 10^8]/[D \times T \times (2 \times A)]$, where R=etch rate as angstroms/min, W is the mass difference in grams, D=density of the metal (aluminum=2.6989 g/cm$^3$), T=time (min), and A=area of the aluminum foil in cm². The results of observations for these tests are shown in Table 4, and gravimetric measurement in Table 5.

TABLE 4

Observation of metal safety tests with aluminum foil used in 5% (w/w %) of varying mole ratio solutions of silicate inhibitor to active agent as KOH, expressed as ($M_i/M_a$). Solutions are tested at 90 C. for 20 min. Observations as solution bubbling and metal appearance following exposure.

| | | | | |
|---|---|---|---|---|
| KASOLV ® 16, moles as $M_i$ | 0.00 | 0.32 | 0.42 | 0.47 |
| KOH, moles as $M_a$ | 0.80 | 0.50 | 0.29 | 0.19 |
| Mole ratio KASOLV ®16/KOH ($M_i/M_a$) | - 0 - | 0.60 | 1.50 | 2.40 |
| Solution observations during test (metal foil) | Extreme vigorous bubbling | Vigorous bubbling | Minor bubbling | No bubbling |
| Metal foil appearance after exposure | Completely dissolved | Etched (attacked) | Partial etch (some damage) | No effect, bright, shiny |

TABLE 5

Metal safety tests in 5% (wt %) solutions using gravimetric measurement on aluminum foil in different mole ratio solutions of silicate inhibitor compared to active agent as KOH, expressed as ($M_i/M_a$). Solutions are tested at 90 C. for 20 min. Observations included as solution bubbling and metal appearance following exposure.

| | | | |
|---|---|---|---|
| Mole ratio KASOLV ®16/KOH ($M_i/M_a$) | 0.88 | 1.04 | 2.39 |
| Solution observations during test (metal foil) | Minor bubbles, 1-2 min | Minor bubbles, 1-2 min | No bubbles |
| Metal foil appearance after exposure | No effect, bright, shiny | No effect, bright, shiny | No effect, bright, shiny |
| Mass metal before (g) | 0.16580 | 0.16042 | 0.16122 |
| Mass metal after (g) | 0.16573 | 0.16033 | 0.16120 |
| Mass difference (g) | 0.00007 | 0.00009 | 0.00002 |
| Etch rate expressed as angstroms/min | 2.55 | 3.28 | 0.73 |

Example #3

The following example demonstrates the dependence of metal safety on a ratio in moles of inhibitor to active agent ($M_i/M_a$) represented numerically and prepared from the solid composition as 5% (wt %) in water. In this case, the inhibitor chosen is an alkali silicate of the form potassium silicate (KASOLV® 16, a powder with ~53% $SiO_2$ (wt %), PQ Corporation). The respective silicate is a solid form material with protective quality dependent upon the silicon dioxide content (wt % $SiO_2$). In this example, the test specimens are parts from a flat panel display manufacturing line with microelectronic features which contain metal deposited areas which are coated by positive photoresist. The metal features are aluminum or aluminum alloys. The positive photoresist is of the variety AZ-4620 (novolak based), manufactured by AZ Electronic Materials (AZEM), located in Branchburg N.J. (USA, www.azem.com) and processed in the same or similar manner as described in this section to deposit a remaining layer of approximately <5 um, and more specifically 1-2 um. The FPD parts with resist coated aluminum features are exposed to the said solutions at the specified conditions for approximately 30 seconds, rinsed in deionized water, and dried. These parts are observed under a light microscope at a magnification range between 100-500× and the appearance of the aluminum is recorded. The parts are then prepared for SEM observation. The results are stated in Table 6.

TABLE 6

Metal safety tests in various cleaners using optical microscopy and SEM on FPD specimens containing aluminum features with a resist coating. Included are different mole ratio solid form solutions of silicate inhibitor ($M_i$) compared to active agent as KOH ($M_a$), expressed as ($M_i/M_a$). Solutions are tested at 60 C. for 30 seconds.

| Solution Description | Acetone cleans | KOH base-line (no silicate) | Solid form (silicate mix) | Solid form (silicate mix) | Solid form (silicate mix) |
|---|---|---|---|---|---|
| Mole ratio KASOLV ®16/KOH ($M_i/M_a$) | Non-applicable | -0- | 0.27 | 0.54 | 0.82 |
| Metal feature observation (OM) | Clean, bright and shiny | Dark, black surface | Partial black-ening | Partial black-ening | Clean, bright and shiny |
| Metal feature observation (SEM) | Smooth surface, no effect | Serious etch, pitting, damage | Partial etched and dull surface | Partial etched and dull surface | Smooth surface, no effect |

Example #4

The following example demonstrates the use of organic additives to minimize or eliminate the formation of residue during processing due to premature drying. The additives are considered as antideposition agents or dispersants. The materials are added as a solid raw material to the mixture, comprising approximately 10% of the total (wt %) represented as the solid form product. This product is diluted as 5% (wt %) in water and observed for any noticeable increase in viscosity of the fluid (thickening). An amount of approximately 5 milliliters (ml) is sent to test tubes of a volume capacity near 10 ml. The top is enclosed to not allow fluid to escape and they are shaken vigorously and set into a test tube rack to measure the foam level which forms over the liquid level. The foam levels are measured using the straight edge ruler device with increments in millimeters (mm). The solution is then applied to glass plates (microscope slides), an amount of 1-2 grams. The plates are transferred to a hot plate held at a temperature of approximately 90 C and allowed to dry. Periodically, more material is added to the plates to produce a visible dried residue. Once a visible dried material remains, the plates are transferred to a hot plate of a temperature >120 C and held there for 30 minutes. After this time, the plates are immersed into deionized water at room temperature for 5 minutes, removed from the liquid, allowed to stand erect and dry, and observed for any residue that remains. Measurements are assigned a number "0" (preferred) or "1" (not preferred). For example, residue removal with neutral water or wash liquid (base solution) is assigned a "0" for complete removal after 5 min, and no foam or thickening of the solution is assigned a "0" (preferred). The numbers are summed to give a total, the lower number is preferred. The observation of residue following this process is shown in Table 7.

TABLE 7

Observation of solution thickening, foaming, and residue after water and wash solution exposure for 5 min, following processing mixtures on glass plates, hot plate drying, and rinsing with deionized water. Mixtures are prepared with 5% (wt %) of solid cleaner in water. The solid cleaner contains ~10% of the dispersing agent within the cleaner matrix.

| # | Additive Chemistry | Manufacturer | Viscosity thickening | Foam | Residue w/water | Residue w/wash | Total: |
|---|---|---|---|---|---|---|---|
| Base | -None- | not applicable | 0 | 0 | 1 | 1 | 2 |
| Kcitrate | Chelate | Noveon | 0 | 0 | 1 | 0 | 1 |
| Capstone | Surfactant | DuPont | 0 | 0 | 1 | 0 | 1 |
| PVP K15 | Polyvinylpyrrolidone | Int. Sci. Prod. (ISP) | 0 | 0 | 1 | 0 | 1 |
| Acrylidone | Polyvinylpyrrolidone | ISP | 0 | 0 | 1 | 0 | 1 |
| Aquazole | Polyvinylpyrrolidone | ISP | 0 | 0 | 1 | 0 | 1 |
| Stabileze | Polyvinylpyrrolidone | ISP | 1 | 0 | 0 | 0 | 1 |
| PVP/VA S630 | Polyvinylpyrrolidone | ISP | 0 | 0 | 1 | 0 | 1 |
| Gantrez | Polyvinylpyrrolidone | ISP | 0 | 0 | 1 | 0 | 1 |
| Klucel | Cellulose | Noveon | 0 | 0 | 1 | 0 | 1 |
| Croda 5M | Surfactant | Croda | 0 | 1 | 0 | 0 | 1 |
| DIPA | Amine | DOW | 0 | 0 | 1 | 1 | 2 |
| CMCAB | Cellulose | Eastman | 0 | 0 | 1 | 1 | 2 |
| Scripset 550 | SMA Copolymer | Ashland | 0 | 0 | 1 | 1 | 2 |
| LiSS | Polystyrene sulfonate | Tosoh | 0 | 0 | 1 | 1 | 2 |
| NaSS | Polystyrene sulfonate | Tosoh | 0 | 0 | 1 | 1 | 2 |
| Resinall | Resin | Resinall | 0 | 0 | 1 | 1 | 2 |
| PVA | Alcohol | Kuraray | 0 | 0 | 2 | 1 | 3 |
| Methocel | Cellulose | DOW | 0 | 1 | 1 | 1 | 3 |
| Croda C | Surfactant | Croda | 0 | 1 | 1 | 1 | 3 |
| Croda M | Surfactant | Croda | 0 | 1 | 1 | 1 | 3 |
| Croda L | Surfactant | Croda | 0 | 1 | 1 | 1 | 3 |

The best dispersing aids which inhibit residue formation are those exhibiting a low number in the column total (i.e. "1"). For example, the potassium citrate (Kcitrate) exhibits a "1" due to non-thickening, non-foaming, and residue removal with the wash agent (i.e. "0").

Example #5

The following example demonstrates the use of replenishment for increasing bath life of the resist remover (cleaning agent). The base solution (wash, cleaning agent, resist remover) comprises a mixture of inhibitor to active agent ($M_i/M_a$) of approximately 0.8 (i.e. $M_i/M_a$=0.8) and prepared as 2% (wt %) in water. The inhibitor is an alkali silicate of the form potassium silicate (KASOLV® 16, a powder with ~53% $SiO_2$ (wt %), PQ Corporation) and active agent is KOH. In this example, the positive photoresist is of the variety AZ-4620 (novolak based), manufactured by AZ Electronic Materials (AZEM), located in Branchburg N.J. (USA, www.azem.com). The PR is dried in aluminum dishes to drive off all carrier solvent, collected, weighed, and dissolved into the cleaning agent at the specified concentrations. The representative amount of PR is the solid form amount, similar to that present on the device substrate. Using this information, conversion from the value of % w/w of loaded PR to substrates is possible with simple assumptions of known thickness and area coverage. Replenishment is normally conducted by adding back a known amount of concentrate at a level which is approximately one-half (½) of the concentration of the original value of the solution. Replenishment of solution activity corresponds to an increase in bath life.

TABLE 8

Measured pH of solutions with varying amounts of PR (% w/w PR loading). A subsequent increase in solution activity as increased pH observed by the replenishment of the solution concentrate. Original solution concentration is approximately 2% (w/w) diluted in water.

| Solution # | Solution Description | Solution Activity as pH | Ref Solution | Change in pH (ref is previous solution) |
|---|---|---|---|---|
| 1 | 2% (w/w) of remover concentrate in water | 12.81 | N/A | N/A |
| 2 | Solution #1 + 0.25% (w/w) PR, total PR = 0.25% (w/w) | 12.70 | 1 | −0.11 |
| 3 | Solution #2 + 0.25% (w/w) PR, total PR = 0.50% (w/w) | 12.52 | 2 | −0.18 |
| 4 | Solution #3 + 0.25% (w/w) PR, total PR = 0.75% (w/w) | 12.35 | 3 | −0.17 |
| 5 | Solution #4 + 0.25% (w/w) PR, total PR = 1.00% (w/w) | 12.26 | 4 | −0.09 |
| 6 | Solution #5 + 1% (w/w) remover concentrate, total PR = 1.00% (w/w) | 12.54 | 5 | +0.28 |

What is claimed is:

1. A solid form composition used in electronic applications as a solid form concentrate to prepare aqueous alkaline solutions of pH 10 or above for removing photoresists from inorganic substrates comprising:
   a metal safe inhibitor comprising an inorganic silicate (Component A);
   an alkali hydroxide agent (Component B) that exhibits a dissociation constant of $\geq 1\times 10^{-3}$ ($pK_b \leq 3$); and,
   a fluorocarbon surfactant (component C);
   wherein the ratio of the respective weight percent values of Component A and Component B as (A wt %)/(B wt %) varies between 0.2 to 10 and the collective sum weight percent of Component A and Component B varies from 10 wt % to about 90 wt %.

2. The solid form composition of claim 1, wherein Component A further comprises one or more compounds selected from benzylic hydroxides catechol, triazoles, benzotriazole, tolytriazole, imidazoles, borates, thiourea, ethylenediaminetetraacetic acid, diethylenetriaminepentaacetic acid, nitrilotriacetic acid, 2,4-pentanedione, reducing sugars, hydroquinones, glyoxal, salicylaldehyde, citric acid or salts thereof, ascorbic acid or salts thereof, hydroxylamines, rosin acids, or vanillin.

3. The solid form composition of claim 1 wherein the alkali hydroxide agent has the formula $M(OH)_n$ where M is Na, K, Li, Cs, Rb, Ca, Mg, Sr, or Ba, and n is 1 or 2; or the alkali hydroxide agent has the formula $(R)_4N^+OH^-$ wherein each R group is $(CH_3)$; each R group is $(CH_2CH_3)$; each R group is $(CH_2CH_2CH_3)_4$; or one R group is $(C_6H_5)$ and the remaining three R groups are $(CH_3)$.

4. The solid form composition of claim 1 wherein Component A further comprises a film forming polymer.

5. The solid form composition of claim 1 wherein Component B is KOH.

6. The solid form composition of claim 1 wherein Component B is LiOH.

7. The solid form composition of claim 1 wherein Component C further comprises an amine.

8. The solid form composition of claim 1 wherein Component C further comprises a water soluble polymer.

9. A method for removing photoresists from inorganic substrates, said method comprising mixing the composition of claim 1 with deionized water to form a solution, contacting the inorganic substrate with the solution at a temperature of between 40-90 degrees Celsius to remove said photoresist, and rinsing the inorganic substrate with water.

10. The method of claim 9 wherein said photoresists are removed from semiconductors or electronic displays.

* * * * *